(12) United States Patent
Clark et al.

(10) Patent No.: US 12,356,586 B2
(45) Date of Patent: Jul. 8, 2025

(54) INFORMATION HANDLING SYSTEM LIQUID COOLING LEAK DETECTION ENCLOSURE

(71) Applicant: Dell Products L.P., Round Rock, TX (US)

(72) Inventors: Peter Clark, Taipei (TW); Kuang-Hsi Lin, Taoyuan (TW); Yu-Feng Lin, Taipei (TW); Rui-Shen Lu, Taipei (TW); Iou-Ren Su, Keelung (TW); Hung-Wen Wu, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 142 days.

(21) Appl. No.: 17/824,693

(22) Filed: May 25, 2022

(65) Prior Publication Data
US 2023/0413474 A1  Dec. 21, 2023

(51) Int. Cl.
 H05K 7/20  (2006.01)
(52) U.S. Cl.
 CPC ..... *H05K 7/20272* (2013.01); *H05K 7/20281* (2013.01)
(58) Field of Classification Search
 CPC ........... H05K 7/20272; H05K 7/20281; H05K 7/20254
 See application file for complete search history.

(56) References Cited

U.S. PATENT DOCUMENTS

| | | | |
|---|---|---|---|
| 4,205,658 A | 6/1980 | Clark | |
| 4,473,066 A | 9/1984 | Clark | |
| 9,593,999 B2 | 3/2017 | Fleury et al. | |
| 10,561,040 B1* | 2/2020 | Lunsman | H05K 7/20272 |
| 10,645,847 B2* | 5/2020 | Edwards | H05K 7/20836 |
| 10,859,461 B2 | 12/2020 | Farkas et al. | |
| 11,175,102 B1* | 11/2021 | Harrington | F28F 9/165 |
| D971,391 S | 11/2022 | Dong et al. | |
| D977,619 S | 2/2023 | Sawafta et al. | |
| 11,686,095 B2 | 6/2023 | Baggs et al. | |
| 11,776,875 B2 | 10/2023 | Zhou et al. | |
| 2014/0251583 A1* | 9/2014 | Eriksen | H05K 7/20772 165/104.33 |
| 2020/0025641 A1* | 1/2020 | Long | H05K 7/20254 |
| 2020/0340767 A1* | 10/2020 | Holden | G01M 3/16 |
| 2021/0392786 A1* | 12/2021 | Chen | H05K 7/20445 |
| 2022/0283050 A1* | 9/2022 | Gao | G01M 3/40 |
| 2023/0328922 A1* | 10/2023 | Tseng | G06F 1/20 361/699 |

FOREIGN PATENT DOCUMENTS

WO   2017023280 A1   2/2017

* cited by examiner

*Primary Examiner* — Jayprakash N Gandhi
*Assistant Examiner* — Matthew Sinclair Muir
(74) *Attorney, Agent, or Firm* — Zagorin Cave LLP; Robert W. Holland

(57) ABSTRACT

Information handling system thermal management of processing components, such as CPU, GPU and/or memory, by a liquid cooling system is protected by a leak detection enclosure having a leak detection sensor disposed in an interior. The leak detection enclosure has a frame coupled to a cold plate that encloses the leak detection sensor and cooling fluid hose fittings so that leaked fluid is trapped within the enclosure for detection by the leak detection sensor. A planar cover couples to the frame upper side over the leak detection circuit and the cooling fluid hose fittings to provide ready assembly and an inexpensive adaptable form factor.

15 Claims, 6 Drawing Sheets

INFORMATION HANDLING SYSTEM LIQUID COOLING LEAK DETECTION ENCLOSURE

BACKGROUND OF THE INVENTION

Field of the Invention

The present invention relates in general to the field of information handling system thermal management, and more particularly to an information handling system liquid cooling leak detection enclosure.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems include a variety of processing components that cooperate to process information using dissipation of direct current power that releases thermal energy as a byproduct of normal operations. As an example, one or more central processing units (CPUs) of an information handling system executes instructions to process information at variable clock speeds based upon the processing load on the system so that thermal energy is released within the information handling system housing with considerable variance over time. CPUs tend to have the greatest impact on information handling system thermals, however, other processing components also release thermal energy, such as random access memory that stores the instructions and information processed by CPUs, storage devices that provide persistent storage, and networking devices that communicate information through wired and wireless signals. Typically, information handling systems include one or more cooling fans that generate a cooling airflow in the housing to help reject excess thermal energy to the external environment. Server information handling systems are often vertically stacked in server racks having cooling airflow intakes at a front face to accept cooled air that exhausts at a rear face to return to an HVAC system for treatment. Reliable data center operations depend upon maintaining information handling systems within defined thermal operating range. Although the above discussion relates to servers in a data center, similar concerns exist for desktop and portable information handling systems. As an example, gamers often use high performance systems with advanced processing a graphics capabilities that can face substantial thermal management challenges. With such client systems, operating at high fan speeds tends to create excessive acoustics, which can detract from the end user experience.

One solution that helps to manage thermal conditions is liquid cooling. Liquid cooling encloses a fluid in a liquid cooling system and translates thermal energy from the information handling system to the liquid, which rejects the thermal energy external to the information handling system housing or, in some cases, to a location within the housing where thermal rejection is more efficient, such as within a cooling airflow or at the housing outer surface. Liquid cooling systems include passive systems, such as vapor chambers that use phase change and wicking to move the liquid, and active systems that use a pump to move the liquid. In an active liquid cooling system, a cold plate is typically coupled to the thermal energy source, such as on a CPU in the place of a heat sink. Liquid pumped through the cold plate accepts excess thermal energy and carries the excess thermal energy to external the information handling system housing for rejection to the environment. Liquid cooling provides efficient thermal transfer to help maintain even the most powerful CPUs and GPUs within operating temperatures, however, liquid cooling tends to involve specialized equipment and fittings to have an adequate thermal interface with the thermal source and to pump cooling fluids without damage to the information handling system. If fluid leaks into the processing components of the information handling system catastrophic failure can occur. Even small amounts of moisture leaked into the information handling system housing can lead to corrosion of electronic components and premature system failure. One way to prevent leaks is to enclose the liquid cooling system in a restricted area that includes a sensor to detect leaked fluid. Enclosures can present difficulty both in how they fit into an information handling system housing and how they interact with different combinations of processing components and liquid cooling equipment types.

SUMMARY OF THE INVENTION

Therefore, a need has arisen for a system and method which encloses a liquid cooling system within an information handling system housing.

In accordance with the present invention, a system and method are provided which substantially reduce the disadvantages and problems associated with previous methods and systems of monitoring a liquid cooled information handling system for cooling fluid leaks. A leak detection enclosure couples to a liquid cooling system cold plate with a frame having a perimeter and height sufficient to enclose cooling hose fittings in a contained area. A planar cover couples over the frame to seal the enclosed leak detection enclosure from external moisture and prevent a leak of fluid at the cold plate from entering the information handling system housing.

More specifically, an information handling system having a liquid cooling system for one or more processing components disposes a cold plate coupled to the processing component with a leak detection enclosure with a leak detection sensor to contain and detect leaks of the liquid cooling system. In one example embodiment, a dual CPU motherboard has first and second cold plates coupled to align with the CPUs by a bracket. Each cold plate has a leak detection sensor coupled to an upper side with a central opening through which intake and exhaust cooling hose fittings extend out. A frame couples to the cold plate around an outer perimeter of the leak detection sensor circuit board and extends ups from the cold plate to have a height of greater than the cooling hose fittings. A cover couples over the frame to define a leak detection enclosure within the frame that captures the upper side of the cold plate and the cooling hose fittings. A planar cover, such as a piece cut from a sheet of mylar, couples to the frame with an adhesive seal so that moisture cannot enter into the leak detection enclosure and any leak within the enclosure is quickly detected without spreading to the information handling system components.

The present invention provides a number of important technical advantages. One example of an important technical advantage is that a leak detection enclosure couples to a liquid cooling system cold plate to isolate the area around cooling house fittings within a leak detection sensor so that any leaks at the cold plate will be detected without causing damage at the information handling system housing. The leak detection enclosure has a frame that defines an interior space at a perimeter of the leak detection sensor and with sufficient height to contain cooling hose fittings. A planar cover couples over the frame upper surface to capture the cooling hose fittings within the frame interior. The assembly of the cover by a sealing adhesive offers a two-part simplified assembly process for the liquid cooling enclosure in which the frame includes structure to couple to the cold plate, such as by defining the structure with an injection molded plastic part, and a cut mylar piece that completes the enclosure with a simplified assembly.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system having liquid cooling includes a leak detection enclosure that isolates a leak detection circuit at a cold plate to support detection of liquid leaks. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
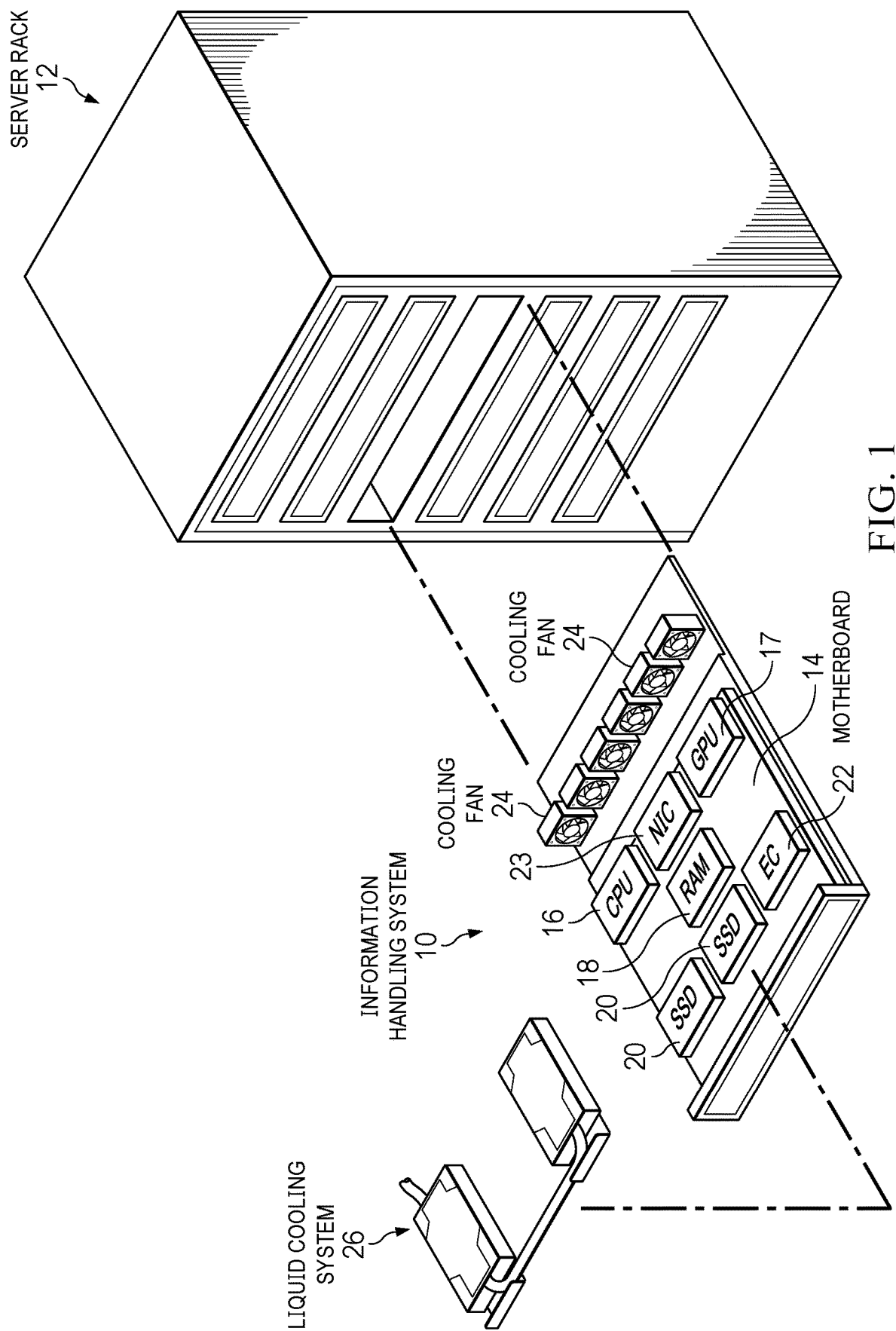
FIG. 1 depicts a server information handling system having a liquid cooling system.

Referring now to FIG. 1, a server information handling system 10 having a liquid cooling system 26 is depicted. In the example embodiment, server information handling system 10 is disposed as a shelf in a server rack 12 that vertically stacks plural server information handling systems, such as for use in a data center environment. In alternative embodiments, other types of information handling systems may have the liquid cooling system and enclosure described herein, such as tower servers, desktop client systems and portable client systems. Information handling system 10 has a motherboard 14 that interfaces processing components that cooperate to process information. For example, a central processing unit (CPU) 16 executes instructions that process information in cooperation with a random access memory (RAM) 18 that stores the instructions and information. A graphics processor unit (GPU) 17 further processes the information to generate visual images for presentation at a display. Solid state drives (SSD) 20 provide persistent storage of the information and instructions during power down of the system for retrieval at power up, such as an operating system and applications that are retrieved to RAM 18 at system boot for execution on CPU 16. An embedded controller (EC) 22 manages system operation on a physical level, such as power and thermal management and interactions between the processing components and with peripheral devices. A network interface controller (NIC) 23 provides communication with external networks, such as through Ethernet cables. Cooling fans 24 provide a cooling airflow through information handling system 10 to remove excess thermal energy and keep the processing components within operating constraints.

Liquid cooling system 26 interfaces with embedded controller 22 to provide additional thermal rejection capability in conjunction with cooling fans 24. For example, liquid cooling system 26 includes a pump that pumps cooling liquid to a cold plate that thermally couples to a processing component, such as CPU 16, GPU 17 and RAM 18. The cold plate accepts thermal energy generated at the processing component from dissipation of power and passes the thermal energy to a liquid that pumps to a location external the housing for rejection to the environment. In addition, the cold plate can help to promote rejection of thermal energy to a cooling airflow provided by cooling fans 24. In one example embodiment, liquid cooling system 26 provides cooling to CPU 16 with a cold plate coupled to the CPU and having a low profile so that cooling airflow of cooling fan 24 has room to pass through the housing without excessive impedance. One challenge of this example embodiment is that a fluid leak within information handling system 10 can result in a catastrophic failure of the system. Another challenge is that liquid cooling system 26 adds to the vertical footprint of the processing component so that airflow is impeded. To address these challenges, liquid cooling system 26 includes a leak detection enclosure as described in greater detail below.

Figure 2:
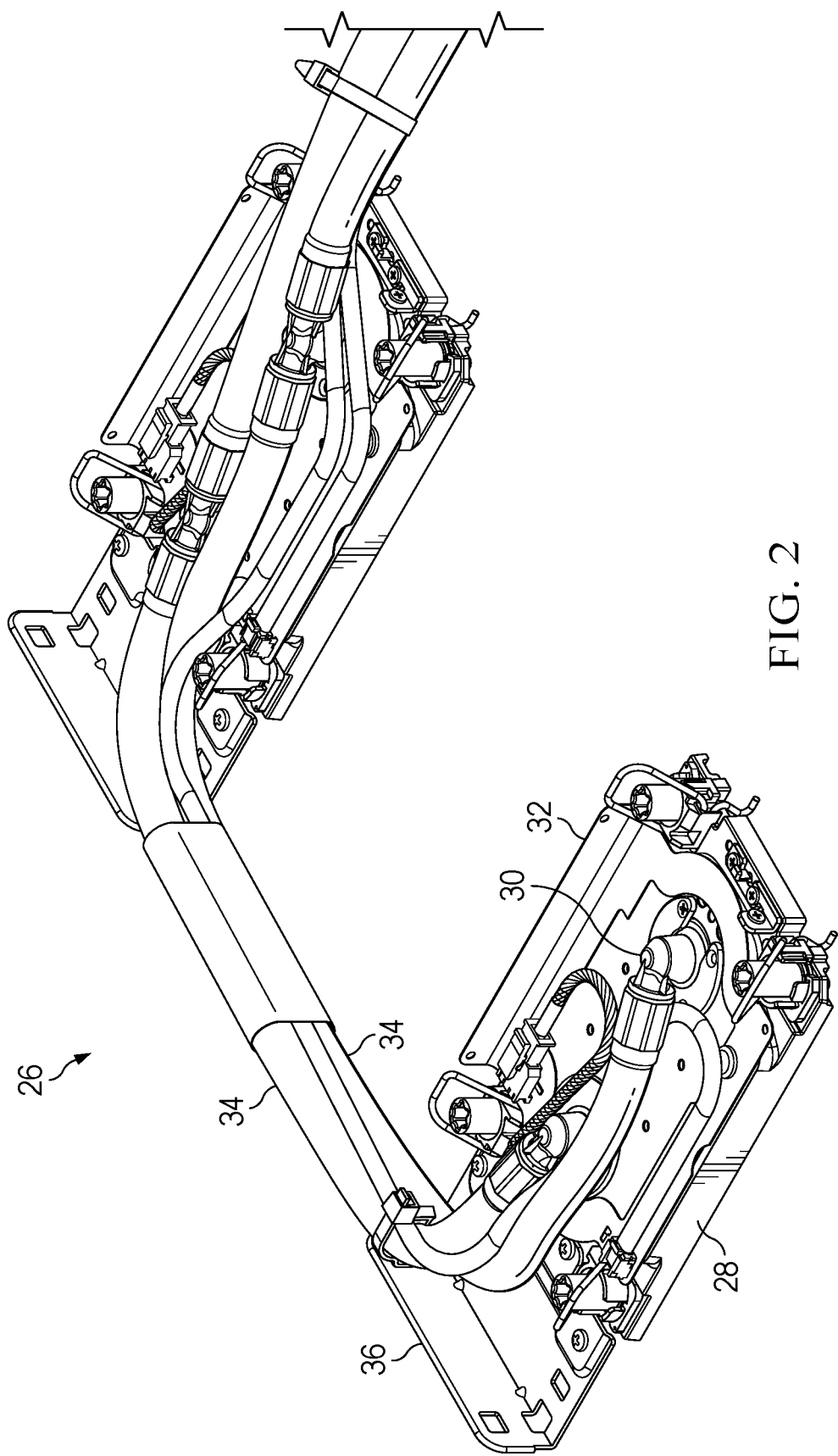
FIG. 2 depicts an example liquid cooling system having a leak detection sensor coupled to a cold plate having cooling hose fittings.

Referring now to FIG. 2, an example is depicted of liquid cooling system 26 having a leak detection sensor 32 coupled to a cold plate 28 having cooling hose fittings 30. In the example embodiment, liquid cooling system 26 has two cold plates 28 that each thermally couple to a processing component, such as a CPU or GPU disposed under the cold plate and coupled to the system motherboard. A first cooling fluid hose 34 brings cooling fluid, such as cold water, from a pump into a first cooling hose fitting 30 of each cold plate 28 that is for cooling fluid intake. The cooling fluid circulates in cold plate 28 to accept excess thermal energy and then exits from a second cooling hose fitting 30 that is for cooling fluid exhaust through a second cooling hose 34 that exhausts heated cooling fluid. Leak detection sensor 32 is a circuit board having exposed conductive material, such as copper wirelines, that detect a closed circuit when current passes through a fluid leaked on the circuit board in contact with adjacent conductive material. Leak detection sensors 32 has a central open region that exposes cold plate 28 at the location of cooling hose fittings 30. If fluid leaks at a cooling hose fitting 30 and reaches leak detection sensor 32, the closing of the circuit by the conductive cooling fluid sends a signal to alert of the leak, such as to the embedded controller, so that corrective actions may be performed, such as shutting off the flow of cooling fluid to the cold plate. In the example embodiment, leak detection sensor 32 has a raised side to aid in the assembly of a leak detection enclosure as described below. In the example embodiment, an assembly bracket 36 aids in assembly and alignment of the cold plates to the motherboard at an appropriate location. In alternative embodiments, other types of leak detection sensors and liquid cooling systems may be used.

Figure 3:
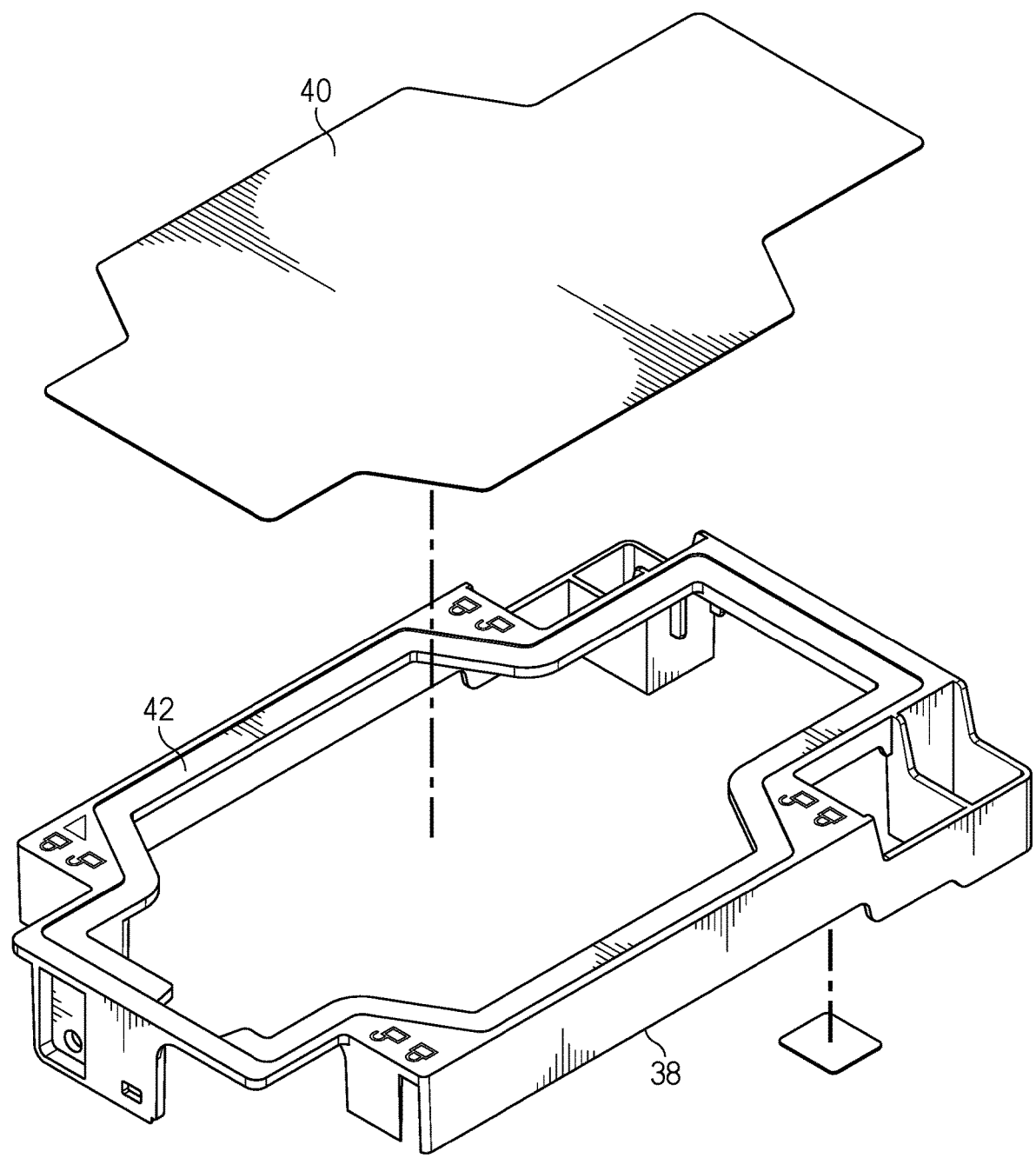
FIG. 3 depicts an exploded perspective view of a leak detection enclosure configured to couple to a liquid cooling system cold plate.

Referring now to FIG. 3, an exploded perspective view depicts a leak detection enclosure configured to couple to a liquid cooling system cold plate. The leak detection enclosure is assembled from a frame 38 and cover 40 that couples to frame 38 with an adhesive seal 42. Frame 38 is an injection mold hard plastic part that includes attachment coupling arrangements to couple to the cold plate at the perimeter of the leak detection circuit. For example frame 38 couples against a seal disposed over the cold plate to define a sealed enclosure base that contains any leaked fluid within the region defined above the cold plate. Cover 40 is a planar surface, such as a sheet of mylar, that fits over and couples to frame 38 to seal the upper side of frame 38 from escape of cooling fluid out of the leak detection enclosure defined by frame 38. Frame 38 provides structure and mounting points with an injection molded piece that can include smaller features useful to assembly of the information handling system and instructions readable by an end user of the information handling system. Cover 40 closes the leak detection enclosure from external moisture that might otherwise condense on the cooling hose and fittings, and cover 40 encloses the interior of frame 38 to prevent escape of any leaked cooling fluid. Cover 40 is, for instance, a 0.5 mm thick cut mylar sheet attached by a sealing adhesive.

Figure 4:
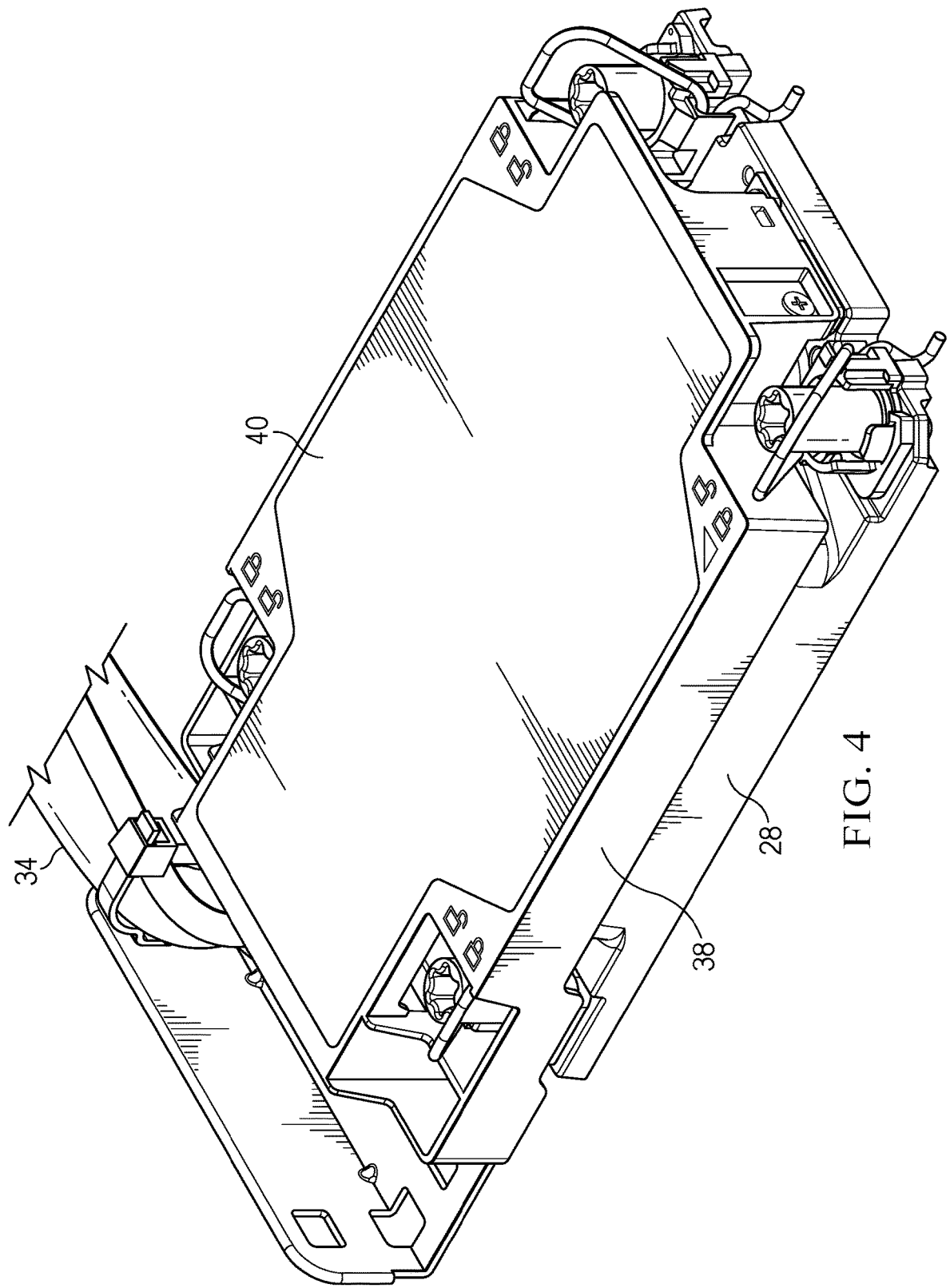
FIG. 4 depicts a side perspective view of the leak detection enclosure coupled to a liquid cooling system cold plate.

Referring now to FIG. 4, a side perspective view depicts the leak detection enclosure coupled to a liquid cooling system cold plate 28. Frame 38 includes coupling arrangements, such as screw openings, that couple to structures of the liquid cooling system and also to the raise side of the leak detection circuit captured within the leak detection enclosure. Cooling hoses 34 pass into the leak detection enclosure through an opening formed in one side of frame 38 to engage the cooling hose fittings within the interior of the leak detection enclosure. Cover 40 couples to the top side of frame 38 with an adhesive that seals the enclosure defined within frame 38. In alternative embodiments, other types of coupling may be used form cover 40, such as screws that press down on a seal disposed at the top side of frame 38. The use of a planar cover provides a defined shape for the footprint of the liquid cooling system within the information handling system housing while the vertical footprint can vary based upon a frame selection that allows for cooling hose fittings of different sizes. For instance, different types of liquid cooling systems might have different types of fittings that vary in height. In the example embodiment, a single cover couples over frame 38 to enclose both the intake and exhaust fittings. In alternative embodiments a separate frame may be used for each fitting so that each fitting has its own leak detection enclosure. As another alternative embodiment, a first planar cover may be used to couple over one fitting while a separate cover couples over a second fitting, such as to compensate for different fitting heights. For example, a taller fitting might have a separate non-planar cover that couples to the frame at the taller fitting and seals against the planar cover.

Figure 5:
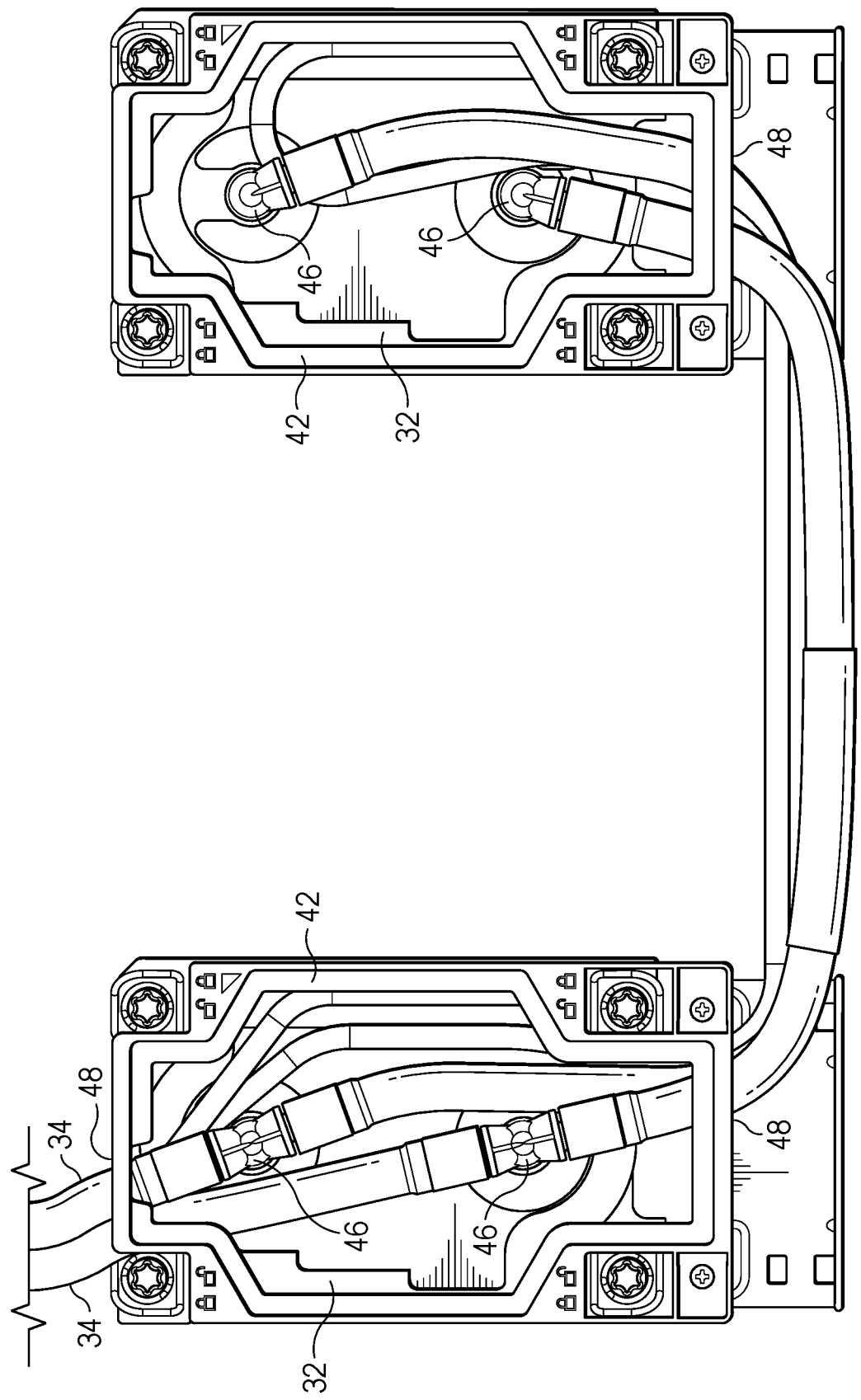
FIG. 5 depicts a top view of the leak detection enclosure coupled to a cold plate and indicating a location of a sectional view.

Referring now to FIG. 5, a top view depicts the leak detection enclosure coupled to a cold plate and indicating a location of a sectional view. In the example embodiment, first and second spaced frames define leak detection enclosures with a space between them that allows for a cooling airflow passage to promote a reduced cooling airflow impedance and direct the cooling airflow towards a channel that has processing components that rely on cooling airflow for thermal management, such as RAM disposed between dual CPUs. Cooling hose fittings 46 and cooling hoses 34 fit within the vertical height of the frame and are captured in a leak detection enclosure when a planar cover couples at sealant adhesive 42. Cooling hoses 34 pass through openings of the frame that are sealed by seals 48 to isolate leak detection circuit 32.

Figure 6:
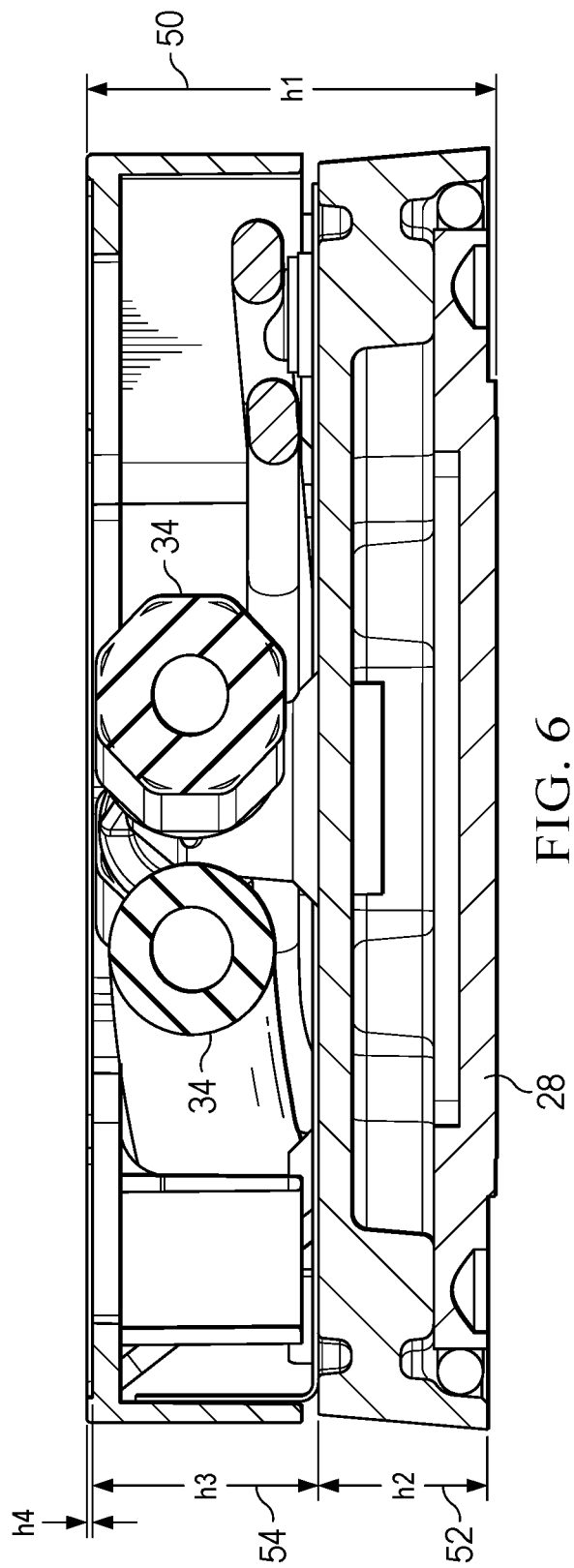
FIG. 6 depicts a cross-sectional view of the leak detection enclosure having liquid cooling system cooling hose fittings enclosed.

Referring now to FIG. 6, a cross-sectional view depicts the leak detection enclosure having liquid cooling system cooling hose fittings enclosed. Leak detection circuit 32 is enclosed in the sealed containment area isolated from external humidity and disposed around the hose fittings to detect any fluid that leaks at the fittings. In the example embodiment, the leak detection enclosure provides a vertical height 50 over the motherboard of approximately 24.6 mm. The total vertical height includes a height 52 of cold plate 28, which couples over and thermally interfaces with an underlying processing component, and a height 54 of the frame and cooling hose fittings. In the example embodiment, height 52 is approximately 10.55 mm and height 54 is approximately 13.5 mm, which leaves a slight additional height of 0.55 mm for the mylar planar cover. In various embodiments, the total height may change to adapt the enclosed area to the size of the cooling hose and cooling hose fittings.

Although the present invention has been described in detail, it should be understood that various changes, substitutions and alterations can be made hereto without departing from the spirit and scope of the invention as defined by the appended claims.

What is claimed is:

1. An information handling system comprising:
  a motherboard;
  plural processing components coupled to the motherboard including at least a processor operable to execute instructions that process information and a memory interfaced with the processor, the memory operable to store the instructions and information;

a liquid cooling system having a cold plate, with a lower surface of the cold plate thermally coupled to one of the plural processing components and interfaced with a cooling liquid that transfers thermal energy from the one of the plural processing components;

an intake fluid hose fitting coupled to the cold plate at an upper surface and configured to couple to an intake fluid hose;

an exhaust fluid hose fitting coupled to the cold plate at the upper surface and configured to couple to an exhaust fluid hose; and a leak detection enclosure coupled to the cold plate at the upper surface of the cold plate and having a frame coupled to the cold plate at the upper surface, a leak detection circuit disposed within the frame and operable to detect the fluid, and a cover separate from the frame and configured to couple to the frame to capture the leak detection circuit in the frame, the cover coupling over the frame to enclose the leak detection circuit, the intake fluid hose fitting and the exhaust fluid hose fitting within an interior defined by the upper surface, the frame and the cover.

2. The information handling system of claim 1 wherein a boundary defined by the leak detection circuit is an interior perimeter of an opening that exposes the cold plate.

3. The information handling system of claim 2 wherein the leak detection circuit comprises exposed conductive material that complete a circuit across fluid that contacts the exposed conductive material.

4. The information handling system of claim 1 wherein the cover has a planar form that couples over both the intake fluid hose fitting and the exhaust fluid hose fitting at a raised height over the cold plate defined by a height of the frame.

5. The information handling system of claim 1 wherein the cover further comprises:

first and second cover portions, the first cover portion configured to couple to the frame at the intake fluid hose fitting and the second cover portion couples to the frame at the exhaust fluid hose fitting.

6. The information handling system of claim 5 wherein the first cover portion has a first height over the intake fluid hose fitting and the second cover portion has a second height over exhaust fluid hose fitting of different than the first height.

7. The information handling system of claim 1 further comprising:

a seal coupled to an upper surface of the frame;

wherein the cover couples to the frame in contact against the seal to form a sealed interior of the frame.

8. The information handling system of claim 7 further comprising:

a first hose coupled to the intake fluid hose fitting and routed through an opening in the frame;

a second hose coupled to the exhaust hose fitting and routed through the opening in the frame; and a seal disposed in the opening in the frame to seal around the first and second hoses and seal the interior of the frame.

9. A method for leak detection at a liquid cooled information handling system, the method comprising:

coupling a leak detection circuit to a cold plate of a liquid cooling system around a fluid hose fitting of the cold plate;

coupling a frame to the cold plate around the leak detection circuit, the frame having a height of at least a height of the fluid hose fitting; and coupling a planar cover to the frame at a frame upper surface to define an interior that encloses the leak detection circuit and the fluid hose fitting within the frame; and wherein the interior is defined by an upper surface of the cold plate, the frame and the cover.

10. The method of claim 9 further comprising:

routing a fluid hose through an opening in a side of the frame to the fluid hose fitting of the cold plate; and coupling a seal to the opening to seal the fluid hose fitting of the cold plate within the frame.

11. The method of claim 9 further comprising:

coupling a seal to an upper surface of the frame; and contacting the seal with the planar cover to seal the fluid hose fitting of the cold plate within the frame.

12. The method of claim 9 wherein the leak detection circuit comprises conductive material that communicates a charge when a fluid contacts the conductive material, the leak detection circuit disposed at an inner perimeter of the frame and having a central opening that exposes the cold plate.

13. The method of claim 10 further comprising:

coupling the leak detection circuit around both an exhaust fluid hose fitting of the cold plate and an intake fluid hose fitting; and sealing both the exhaust fluid hose fitting and the intake fluid hose fitting by coupling the planar cover to the frame.

14. The method of claim 9 further comprising thermally coupling the cold plate to a central processing unit.

15. The method of claim 9 further comprising thermally coupling the cold plate to a graphics processing unit.

* * * * *